United States Patent
Li et al.

(10) Patent No.: US 10,985,342 B2
(45) Date of Patent: Apr. 20, 2021

(54) DISPLAY DEVICE

(71) Applicants: Ordos Yuansheng Optoelectronics Co., Ltd., Inner Mongolia (CN); BOE Technology Group Co., Ltd., Beijing (CN)

(72) Inventors: Fashun Li, Beijing (CN); Xuefei Bai, Beijing (CN); Yuedong Shang, Beijing (CN)

(73) Assignees: Ordos Yuansheng Optoelectronics Co., Ltd., Inner Mongolia (CN); BOE Technology Group Co., Ltd., Beijing (CN)

( * ) Notice: Subject to any disclaimer, the term of this patent is extended or adjusted under 35 U.S.C. 154(b) by 163 days.

(21) Appl. No.: 16/334,244

(22) PCT Filed: May 31, 2018

(86) PCT No.: PCT/CN2018/089145
§ 371 (c)(1),
(2) Date: Mar. 18, 2019

(87) PCT Pub. No.: WO2019/037502
PCT Pub. Date: Feb. 28, 2019

(65) Prior Publication Data
US 2019/0386245 A1    Dec. 19, 2019

(30) Foreign Application Priority Data

Aug. 25, 2017  (CN) .......................... 201710744739.7

(51) Int. Cl.
*H01L 51/52* (2006.01)
*H01L 27/32* (2006.01)
*H01L 23/00* (2006.01)

(52) U.S. Cl.
CPC ........ *H01L 51/5246* (2013.01); *H01L 23/562* (2013.01); *H01L 27/322* (2013.01); *H01L 27/3244* (2013.01)

(58) Field of Classification Search
CPC ............. H01L 51/5246; H01L 27/3244; H01L 51/0096; H01L 23/562; H05K 5/0217
See application file for complete search history.

(56) References Cited

U.S. PATENT DOCUMENTS 6,724,150 B2 *   4/2004   Maruyama ............ H01L 51/524
                                                        315/169.3
8,789,984 B2 *   7/2014   Lee ....................... H01L 51/524
                                                           362/362

(Continued)

FOREIGN PATENT DOCUMENTS

CN        104393186 A      3/2015
CN        105895825 A      8/2016

(Continued)

OTHER PUBLICATIONS

First Office Action and English language translation, CN Application No. 201710744739.9, dated Feb. 28, 2019, 10 pp.

(Continued)

*Primary Examiner* — Bac H Au
(74) *Attorney, Agent, or Firm* — Myers Bigel, P.A.

(57) ABSTRACT

The present disclosure provides a display device. The display device includes a first substrate, the first substrate being provided with a first relief groove, a second substrate, the second substrate being provided with a second relief groove, and a sealant. The sealant is sandwiched between the first substrate and the second substrate so as to seal the first substrate and the second substrate. Furthermore, the sealant is spaced apart from outer edges of the first substrate and the second substrate. The first relief groove is located between the sealant and the outer edge of the first substrate, and the (Continued)

second relief groove is located between the sealant and the outer edge of the second substrate.

9 Claims, 2 Drawing Sheets

(56) References Cited

U.S. PATENT DOCUMENTS

| | | | | |
|---|---|---|---|---|
| 9,859,522 | B2* | 1/2018 | Yang | H01L 51/5246 |
| 9,954,199 | B2* | 4/2018 | Ishii | H01L 27/3244 |
| 10,454,068 | B2* | 10/2019 | Lee | H01L 27/3211 |
| 2011/0012506 | A1* | 1/2011 | Seo | H01L 51/524 |
| | | | | 313/504 |
| 2011/0297942 | A1* | 12/2011 | Kim | H01L 51/524 |
| | | | | 257/59 |
| 2014/0183465 | A1* | 7/2014 | Jeong | H01L 51/5237 |
| | | | | 257/40 |
| 2016/0247981 | A1* | 8/2016 | Yang | H01L 51/5246 |
| 2017/0054104 | A1* | 2/2017 | Go | H01L 51/5246 |
| 2018/0062111 | A1* | 3/2018 | Kim | H01L 51/5253 |
| 2018/0157110 | A1* | 6/2018 | Park | H01L 51/5281 |
| 2019/0207160 | A1* | 7/2019 | Wang | H01L 51/5256 |

FOREIGN PATENT DOCUMENTS

| | | |
|---|---|---|
| CN | 106354314 A | 1/2017 |
| CN | 107358871 A | 11/2017 |
| CN | 207038046 U | 2/2018 |
| JP | 2000-100562 A | 4/2000 |

OTHER PUBLICATIONS

International Search Report and Written Opinion of the International Searching Authority (with English language translation of Written Opinion), International Application No. PCT/CN2018/089145, dated May 31, 2018, 14 pp.

* cited by examiner

DISPLAY DEVICE

CROSS REFERENCE TO RELATED APPLICATIONS

The present application is a 35 U.S.C. 371 national stage application of PCT International Application No. PCT/CN2018/089145, filed on May 31, 2018, which claims the benefit of Chinese Patent Application No. 201710744739.7 filed on Aug. 25, 2017, the contents of which are incorporated herein by reference in their entireties. The above-referenced International Application was published in the Chinese language as International Publication No. WO 2019/037502 A1 on Feb. 28, 2019.

TECHNICAL FIELD

The present disclosure relates to the technical field of display device, and in particular to a display device.

BACKGROUND ART

For a display device in related techniques, a damage crack will extend to the inside of the display device when its edge bumps against something and gets damaged. When the crack extends to the sealant, the sealant will be easily impaired. This affects the encapsulation effect of the display device, and in turn affects the use of the display device.

SUMMARY

According to an embodiment of the present disclosure, a display device is provided. Specifically, the display device comprises: a first substrate, the first substrate being provided with a first relief groove; a second substrate, the second substrate being provided with a second relief groove; and a sealant, wherein the sealant is sandwiched between the first substrate and the second substrate so as to seal the first substrate and the second substrate. The sealant is spaced apart from outer edges of the first substrate and the second substrate. The first relief groove is located between the sealant and the outer edge of the first substrate. The second relief groove is located between the sealant and the outer edge of the second substrate.

According to a specific implementation, in the display device provided by an embodiment of the present disclosure, the first relief groove comprises a first inner relief groove located in an inner surface of the first substrate facing the second substrate, and a first outer relief groove located in an outer surface of the first substrate facing away from the second substrate. Besides, similarly, the second relief groove comprises a second inner relief groove located in an inner surface of the second substrate facing the first substrate, and a second outer relief groove located in an outer surface of the second substrate facing away from the first substrate.

According to a specific implementation, in the display device provided by an embodiment of the present disclosure, in an extending plane of the first substrate, a size of a cross section of the first inner relief groove decreases gradually from the inner surface of the first substrate to the outer surface of the first substrate, and a size of a cross section of the first outer relief groove increases gradually from the outer surface of the first substrate to the inner surface of the first substrate. Besides, similarly, in an extending plane of the second substrate, a size of a cross section of the second inner relief groove decreases gradually from the inner surface of the second substrate to the outer surface of the second substrate, and a size of a cross section of the second outer relief groove increases gradually from the outer surface of the second substrate to the inner surface of the second substrate.

According to a specific implementation, in the display device provided by an embodiment of the present disclosure, in a plane perpendicular to the extending plane of the first substrate, the first inner relief groove and the first outer relief groove both have a trapezoid cross section. Furthermore, in a plane perpendicular to the extending plane of the second substrate, the second inner relief groove and the second outer relief groove both have a trapezoid cross section.

According to a specific implementation, in the display device provided by an embodiment of the present disclosure, the first inner relief groove and the first outer relief groove are spaced apart in a thickness direction of the first substrate. Similarly, the second inner relief groove and the second outer relief groove are spaced apart in a thickness direction of the second substrate.

According to a specific implementation, in the display device provided by an embodiment of the present disclosure, the first inner relief groove is located closer to the outer edge of the first substrate than the first outer relief groove is, and the second inner relief groove is located closer to the outer edge of the second substrate than the second outer relief groove is.

According to a specific implementation, in the display device provided by an embodiment of the present disclosure, the sealant extends along perimeters of the second substrate and the first substrate, the first relief groove extends along the perimeter of the first substrate, and the second relief groove extends along the perimeter of the second substrate.

According to a specific implementation, in the display device provided by an embodiment of the present disclosure, the first relief groove is located adjacent to a central position between the sealant and the outer edge of the first substrate. Furthermore, similarly, the second relief groove is located adjacent to a central position between the sealant and the outer edge of the second substrate.

According to a specific implementation, in the display device provided by an embodiment of the present disclosure, the first substrate comprises a color filter substrate, and the second substrate comprises a thin film transistor substrate.

According to a specific implementation, in the display device provided by an embodiment of the present disclosure, the display device comprises an active matrix organic light emitting diode (AMOLED) panel.

BRIEF DESCRIPTION OF DRAWINGS

Various aspects and/or advantages of the present disclosure will be rendered more obvious and more comprehensible in the detailed description of the embodiments in combination with the drawings below, wherein.

DETAILED DESCRIPTION OF EMBODIMENTS

Figure 1:
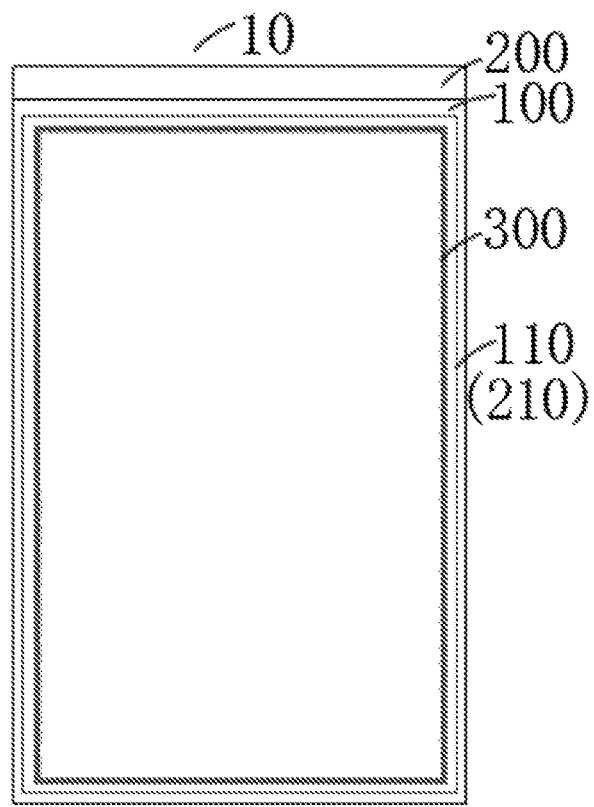
FIG. 1 shows a schematic structure view of a display device according to an embodiment of the present disclosure.

Embodiments of the present disclosure will be described in detail below. Examples of the embodiments are shown in the drawings, wherein same or similar signs are used to indicate same or similar elements or elements having same or similar functions throughout the description. The embodiments described below with reference to the drawings are exemplary, and they are only used for explaining the present disclosure, instead of limiting the present disclosure.

In the following detailed description, various components mentioned in embodiments of the present disclosure are indicated by the following reference signs respectively: display device 1, first substrate 100, first relief groove 110, first inner relief groove 111, first outer relief groove 112, second substrate 200, second relief groove 210, second inner relief groove 211, second outer relief groove 212, sealant 300, and external force F.

The display device according to an embodiment of the present disclosure will be described in detail with reference to the drawings.

As shown in FIGS. 1-4, the display device 1 according to an embodiment of the present disclosure comprises a first substrate 100, a second substrate 200 and a sealant 300.

Specifically, the first substrate 100 is provided with a first relief groove 110. The second substrate 200 is provided with a second relief groove 210. The sealant 300 is sandwiched between the first substrate 100 and the second substrate 200 so as to seal the first substrate 100 and the second substrate 200. The sealant 300 is spaced apart from outer edges of the first substrate 100 and the second substrate 200, wherein the first relief groove 110 is located between the sealant 300 and the outer edge of the first substrate 100, and the second relief groove 210 is located between the sealant 300 and the outer edge of the second substrate 200.

Figure 2:
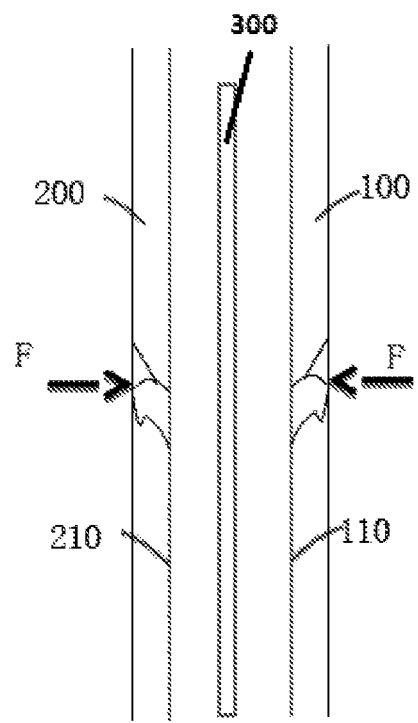
FIG. 2 shows a partial schematic structure view of a display device according to an embodiment of the present disclosure.

According to an embodiment of the present disclosure, in the display device 1, when the outer edge of the first substrate 100 and/or the second substrate 200 is knocked by an external force in a certain position, for example, as shown in FIG. 2, the display device 1 will be subjected to the effect of the external force F. Apparently, it should be pointed out that, in addition to the external force F as shown in FIG. 2, the display device 1 can also be subjected to the effect of an external force from other directions, and the present disclosure is not limited in this aspect. The external force F will cause cracks in the display device 1, and such cracks will extend to the inside along the outer edge of the first substrate 100 and/or the second substrate 200. As compared with the display device in the related techniques, in an embodiment of the present disclosure, by providing the first relief groove 110 and the second relief groove 210, the cracks will stop extending to the inside due to the blocking when they extend to the first relief groove 110 and/or the second relief groove 210. In this way, the cracks can be blocked by means of the first relief groove 110 and the second relief groove 210. This minimizes the influence of bumps on the encapsulation effect of the display device 1. Thereby, the encapsulation and/or sealing performance of the display device 1 is ensured, which helps to avoid damages to the sealing performance of the display device 1 due to cracks caused by bumps, and improves the sealing reliability of the display device 1.

Furthermore, since the sealant 300 has a fragile quality of glass, cracks caused on the outer edge of the first substrate 100 and/or the second substrate 200 will easily damage the sealant 300. In an embodiment of the present disclosure, by providing the first relief groove 110 and the second relief groove 210 in order to prevent the cracks from extending to the inside, protection over the sealant 300 sandwiched between the first substrate 100 and the second substrate 200 can also be ensured. As a result, problems such cracks in the sealant 300 caused by cracks extending to the sealant 300 are avoided. Thus, the sealing reliability of the sealant 300 is ensured, and the use reliability and stability of the sealant 300 are improved.

Furthermore, by providing the first relief groove 110 and the second relief groove 210 in order to reduce bumping damage to the display device 1, defective rate of the display device 1 can also be reduced. Therefore, the production quality of the display device 1 can be improved, and the production cost of the display device 1 can be reduced, thereby promoting the protection efficiency of the display device 1.

Besides, by providing the first relief groove 110 and the second relief groove 210 in order to reduce bumping damage to the display device 1, damage to the display device 1 caused by bumps during delivery can also be avoided. In this case, the delivery of the display device 1 is facilitated and the delivery cost is reduced, which can improve the delivery efficiency of the display device 1.

Therefore, according to an embodiment of the present disclosure, the display device 1 facilitates reduction of bumping damage and has advantages such as high reliability.

Description of the display device 1 according to specific embodiments of the present disclosure will be continued below with reference to the drawings.

In some specific embodiments of the present disclosure, for example, as shown in FIGS. 1-4, the display device 1 comprises a first substrate 100, a second substrate 200 and a sealant 300.

Figure 3:
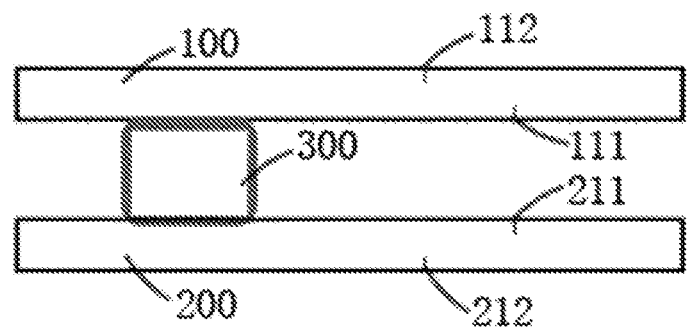
FIG. 3 shows a partial schematic structure view of a display device according to another embodiment of the present disclosure.
Figure 4:
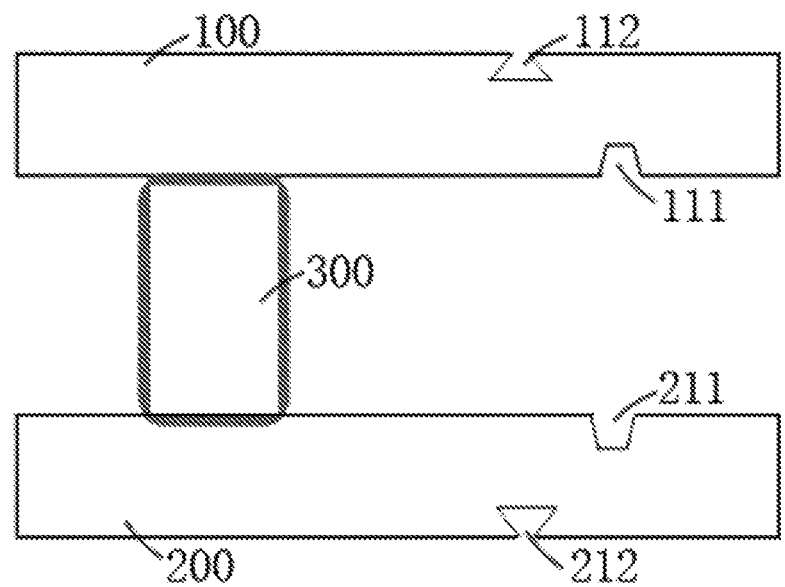
FIG. 4 shows a partial schematic structure view of a display device according to yet another embodiment of the present disclosure.

Specifically, as shown in FIGS. 3 and 4, the first relief groove 110 comprises a first inner relief groove 111 arranged in an inner surface of the first substrate 100, and a first outer relief groove 112 arranged in an outer surface of the first substrate 100. Similarly, the second relief groove 210 comprises a second inner relief groove 211 arranged in an inner surface of the second substrate 200, and a second outer relief groove 212 arranged in an outer surface of the second substrate 200. In this case, the first relief groove 110, i.e., the first inner relief groove 111 and the first outer relief groove 112, can block the cracks in the inner surface and the outer surface of the first substrate 100 respectively. Likewise, the second relief groove 210, i.e., the second inner relief groove 211 and the second outer relief groove 212, can block the cracks in the inner surface and the outer surface of the second substrate 200 respectively. Thereby, cracks from all directions can be blocked in any position along the outer edge of the entire display device 1, such that the package of the display device 1 will not crack when subjected to an external force in any direction.

More specifically, as shown in FIG. 4, in an extending plane of the first substrate 100, i.e., a plane perpendicular to the paper plane of the drawing, a size (e.g., width) of a cross section of the first inner relief groove 111 decreases gradually from the inner surface of the first substrate 100 to the outer surface, and a size (e.g., width) of a cross section of the first outer relief groove 112 increases gradually from the outer surface of the first substrate 100 to the inner surface. Similarly, as shown in FIG. 4, in an extending plane of the second substrate 200, i.e., a plane perpendicular to the paper plane of the drawing, a size (e.g., width) of a cross section of the second inner relief groove 211 decreases gradually from the inner surface of the second substrate 200 to the outer surface, and a size (e.g., width) of a cross section of the second outer relief groove 212 increases gradually from the outer surface of the second substrate 200 to the inner surface. This can not only ensure the blocking effect of the cracks by the first relief groove 110 and the second relief groove 210, but also prevent unevenness of the outer surfaces of the first substrate 100 and the second substrate 200 due to the relief grooves. Therefore, while the extension of cracks is prevented effectively, surface evenness of the display device 1 can be ensured to the maximum degree. Thus, the aesthetic appearance of the first substrate 100 and the second substrate 200 is improved.

Furthermore, as shown in FIG. 4, in a plane perpendicular to the extending plane of the first substrate 100, i.e., the paper plane of the drawing, the first inner relief groove 111 and the first outer relief groove 112 both have a trapezoid cross section. Similarly, in a plane perpendicular to the extending plane of the second substrate 200, i.e., the paper plane of the drawing, the second inner relief groove 211 and the second outer relief groove 212 both have a trapezoid cross section. In this way, not only the blocking effect can be ensured, but also the first outer relief groove 112 and the second outer relief groove 212 can have a smaller opening on the exposed side, which further reduces influences on the aesthetic appearance.

Optionally, as shown in FIGS. 3 and 4, the first inner relief groove 111 and the first outer relief groove 112 are spaced apart in a thickness direction of the first substrate 100, and the second inner relief groove 211 and the second outer relief groove 212 are spaced apart in a thickness direction of the second substrate 200. This can prevent the first inner relief groove 111 and the first outer relief groove 112 from overlapping in the thickness direction of the first substrate 100, thereby avoiding an excessively low local strength of the first substrate 100 and facilitating improvement in strength and rigidity of the first substrate 100. Similarly, the second inner relief groove 211 and the second outer relief groove 212 are spaced apart in a thickness direction of the second substrate 200, i.e., they do not overlap each other. This also avoids an excessively low local strength of the second substrate 200 and facilitates improvement in strength and rigidity of the second substrate 200.

Furthermore, as shown in FIGS. 3 and 4, the first inner relief groove 111 is arranged closer to the outer edge of the first substrate 100 than the first outer relief groove 112 is, and the second inner relief groove 211 is arranged closer to the outer edge of the second substrate 200 than the second outer relief groove 212 is. Since the outer surfaces of the first substrate 100 and the second substrate 200 are more apt to bump against something and thus result in cracks, by taking the above measures, cracks in the outer surfaces of the first substrate 100 and the second substrate 200 can be blocked more effectively by means of the first outer relief groove 112 and the second outer relief groove 212.

Optionally, the first outer relief groove 112 is arranged closer to the outer edge of the first substrate 100 than the first inner relief groove 111 is, and the second outer relief groove 212 is arranged closer to the outer edge of the second substrate 200 than the second inner relief groove 211 is. In this way, not only can the cracking relief effect of the first substrate 100 and the second substrate 200 be ensured, but also the strength and the rigidity of the first substrate 100 and the second substrate 200 can be ensured.

Specifically, as shown in FIG. 1, the sealant 300 extends along the perimeters of the second substrate 200 and the first substrate 100, the first relief groove 110 extends along the perimeter of the first substrate 100, and the second relief groove 210 extends along the perimeter of the second substrate 200. In this way, cracks can be blocked in all directions on the circumference of the first substrate 100 and the second substrate 200, and thus better protection over the sealant 300 can be provided.

Optionally, as shown in FIG. 1, the second relief groove 210 is arranged adjacent to a central position between the sealant 300 and the outer edge of the second substrate 200, and the first relief groove 110 is arranged adjacent to a central position between the sealant 300 and the outer edge of the first substrate 100. This can not only prevent the relief grooves from being too close to the edges, but also prevent the relief grooves from being too close to the sealant 300. Thereby, cracks caused by a larger external force are prevented from extending directly to the inside of the substrate, thus helping to ensure the sealing effect of the sealant 300 at the same time. Furthermore, this can improve the blocking effect by the second relief groove 210 and the first relief groove 110, and ensure the blocking reliability by the second relief groove 210 and the first relief groove 110.

Specifically, the first substrate 100 comprises a color filter substrate, and the second substrate 200 comprises a thin film transistor substrate. Therefore, the structure of a relief groove can be applied to structures that require a dual-layered glass encapsulation, such as LEDs, so as to facilitate improvements in production quality and use reliability.

Optionally, the display device 1 comprises an active matrix organic light emitting diode (AMOLED) panel. This can improve the resistance of the AMOLED panel to bumping damage and help to reduce the production cost of the AMOLED panel.

To be more specific, the first relief groove 110 and the second relief groove 210 can be formed by an etching process.

According to an embodiment of the present disclosure, the display device 1 can further comprise any other suitable composition structure, which should be easily conceivable for one having ordinary skills in the art and will not be detailed herein for simplicity.

It should be understood that, in the description of the present disclosure, orientational or positional relations indicated by terms such as "center", "longitudinal", "transversal", "length", "width", "thickness", "up", "down", "front", "back", "left", "right", "vertical", "horizontal", "top", "bottom", "inner", "outer", "clockwise", "anticlockwise", "axial" and "radial" are all orientational or positional relations based on the drawings. They are used only for describing the present disclosure and simplifying the description, instead of indicating or hinting that the indicated devices or elements must be orientated specifically, or constructed and operated in a specific orientation. So, they cannot be understood as limiting the present disclosure. Beside, features defined by terms such as "first" and "second" may indicate explicitly or implicitly that one or more such features are comprised. In the description of the present disclosure, unless otherwise explained, "multiple" means two or more.

It should be further noted that in the description of the present disclosure, unless otherwise prescribed and defined explicitly, terms such as "mount", "link" and "connect" should be understood in a broad sense. For example, "connect" can refer to fixed connection, or detachable connection, or integrated connection. Alternatively, it can refer to mechanical connection, or electrically connection. Further alternatively, it can refer to direct connection, indirect connection via an intermediate media, or even connection inside two elements. For a person having ordinary skills in the art, the specific meanings of the above terms in the present disclosure can be understood upon specific situations.

In the depiction of the present description, terms such as "an embodiment", "some embodiments", "schematic embodiment", "example", "specific example" or "some examples" are intended to mean that specific features, structures, materials or characteristics described with reference to the embodiment or example are comprised in at least one embodiment or example of the present disclosure. In this description, schematic expressions of the above terms do not necessarily refer to the same embodiment or example. Moreover, specific features, structures, materials or characteristics described thereby can be combined in a suitable manner in any one or more embodiments or examples.

Although the embodiments of the present disclosure have been shown and described, one having ordinary skills in the art can understand that various variations, amendments, substitutions and modifications can be made to these embodiments without deviating from the principle and the aim of the present disclosure, and the scope of the present disclosure is only defined by the claims and equivalents thereof.

The invention claimed is:

1. A display device, comprising:
   a first substrate, the first substrate comprising a first relief groove;
   a second substrate, the second substrate comprising a second relief groove; and
   a sealant,
   wherein the sealant is between the first substrate and the second substrate so as to seal the first substrate and the second substrate,
   wherein the sealant is spaced apart from an outer edge of the first substrate and an outer edge the second substrate,
   wherein the first relief groove is between the sealant and the outer edge of the first substrate,
   wherein the second relief groove is between the sealant and the outer edge of the second substrate,
   wherein the first relief groove comprises a first inner relief groove in an inner surface of the first substrate facing the second substrate and a first outer relief groove in an outer surface of the first substrate facing away from the second substrate, and
   wherein the second relief groove comprises a second inner relief groove in an inner surface of the second substrate facing the first substrate and a second outer relief groove in an outer surface of the second substrate facing away from the first substrate.

2. The display device according to claim 1,
   wherein in an extending plane of the first substrate, a first size of a cross section of the first inner relief groove decreases from the inner surface of the first substrate to the outer surface of the first substrate, and
   wherein a second size of a cross section of the first outer relief groove increases from the outer surface of the first substrate to the inner surface of the first substrate, and
   wherein in an extending plane of the second substrate, a third size of a cross section of the second inner relief groove decreases from the inner surface of the second substrate to the outer surface of the second substrate, and
   wherein a fourth size of a cross section of the second outer relief groove increases from the outer surface of the second substrate to the inner surface of the second substrate.

3. The display device according to claim 2,
   wherein in a plane perpendicular to the extending plane of the first substrate, the first inner relief groove and the first outer relief groove have a trapezoid cross section, and
   wherein in a plane perpendicular to the extending plane of the second substrate, the second inner relief groove and the second outer relief groove have a trapezoid cross section.

4. The display device according to claim 1,
   wherein the first inner relief groove and the first outer relief groove are spaced apart in a first direction of the first substrate, and
   wherein the second inner relief groove and the second outer relief groove are spaced apart in a second direction of the second substrate.

5. The display device according to claim 4,
   wherein the first inner relief groove is closer to the outer edge of the first substrate than the first outer relief groove, and
   wherein the second inner relief groove is closer to the outer edge of the second substrate than the second outer relief groove.

6. The display device according to claim 1,
   wherein the sealant extends along a perimeter of the second substrate and a perimeter the first substrate,
   wherein the first relief groove extends along the perimeter of the first substrate, and
   wherein the second relief groove extends along the perimeter of the second substrate.

7. The display device according to claim 1,
   wherein the first relief groove is adjacent to a first central position between the sealant and the outer edge of the first substrate, and
   wherein the second relief groove is adjacent to a second central position between the sealant and the outer edge of the second substrate.

8. The display device according to claim 1,
   wherein the first substrate comprises a color filter substrate, and
   wherein the second substrate comprises a thin film transistor substrate.

9. The display device according to claim 1,
   wherein the display device comprises an active matrix organic light emitting diode (AMOLED) panel.

* * * * *